(12) United States Patent
Yen

(10) Patent No.: US 7,282,938 B2
(45) Date of Patent: Oct. 16, 2007

(54) TESTING APPARATUS AND METHOD FOR PROVIDING TEMPERATURE STRESS TO ELECTRONIC COMPONENT

(75) Inventor: Wen-Dong Yen, Tainan (TW)

(73) Assignee: Silicon Integrated Systems Corp., Hsin-Chu (TW)

( * ) Notice: Subject to any disclaimer, the term of this patent is extended or adjusted under 35 U.S.C. 154(b) by 0 days.

(21) Appl. No.: 11/293,146

(22) Filed: Dec. 5, 2005

(65) Prior Publication Data

US 2007/0126447 A1    Jun. 7, 2007

(51) Int. Cl.
*G01R 31/02* (2006.01)
(52) U.S. Cl. .................. 324/763; 324/760
(58) Field of Classification Search ............... None
See application file for complete search history.

(56) References Cited

U.S. PATENT DOCUMENTS

| | | | | |
|---|---|---|---|---|
| 3,548,157 A | * | 12/1970 | Lauck | 219/501 |
| 4,374,316 A | * | 2/1983 | Inamori et al. | 219/209 |
| 5,420,520 A | * | 5/1995 | Anschel et al. | 324/754 |
| 5,420,521 A | * | 5/1995 | Jones | 324/760 |
| 5,568,054 A | * | 10/1996 | Iino et al. | 324/760 |
| 5,802,856 A | * | 9/1998 | Schaper et al. | 62/3.7 |
| 6,504,392 B2 | * | 1/2003 | Fredeman et al. | 324/760 |
| 6,518,782 B1 | * | 2/2003 | Turner | 324/760 |
| 6,956,392 B2 | * | 10/2005 | Wright | 324/760 |
| 7,082,676 B2 | * | 8/2006 | Ramirez et al. | 29/741 |

* cited by examiner

*Primary Examiner*—Minh N. Tang
(74) *Attorney, Agent, or Firm*—Squire, Sanders & Dempsey L.L.P.

(57) ABSTRACT

An improved apparatus and method for testing experiment is disclosed. The apparatus includes a motherboard and a stress module. The motherboard includes a component under test. A stress module connects the component and contacts the component directly. The stress module can provide the component with various rages of temperature and voltage for test. Besides, the stress module also can provide an anti-electrostatic device to prevent electrostatic disturbance.

19 Claims, 5 Drawing Sheets

TESTING APPARATUS AND METHOD FOR PROVIDING TEMPERATURE STRESS TO ELECTRONIC COMPONENT

BACKGROUND OF THE INVENTION

1. Field of the Invention

The present invention relates to testing apparatus and method, and more particularly relates to testing apparatus and method by providing a motherboard to test a component under test.

2. Description of the Prior Art

For the process of manufacturing integrated circuit (IC) chips, the reliability of products is a very important factor. Reliability is defined as the lifetime of a product under normal conditions. For knowing the lifetime of the products in a short time, the manufacturers usually put products to the accelerated lifetime tests to predict the average lifetime of products. The tests utilize tougher working conditions than normal, i.e. higher temperature, voltage, current, or pressure, for testing the lifetime of product in the harsh conditions and use the lifetime model to simulate the lifetime in normal conditions.

Typical reliability tests are divided into wafer-level reliability (WLR) tests and package-level reliability (PLR) tests. The WLR test apparatuses to test the wafer directly on a tester in a production line. The PLR test apparatuses to segment and package a wafer as devices-under-test (DUT), and to insert those DUTs into a DUT board to test in a high temperature oven. The stress condition of the PLR test is closer to normal working conditions of products, and the test result is more accepted by manufactures.

A typical IC PLR electric property tester is illustrated in FIG. 1, which is a schematic diagram of ap IC tester 10. The IC tester 10 contains a temperature control oven chamber 12 and a heat-resistance material 16. The thermal-resistance material 16 is fixed in the oven door 14 and cannot be moved for isolating a temperature of the temperature control oven chamber 12. The heat-resistance material 16 has some sliced crevices 18, therefore many DUT boards 13 can pass through the sliced crevices 18 to load on the oven door 14. The DUT board 13 includes a socket 19 to put a DUT 17, a testing lead 15 and a testing interface 11 to contact a DUT contacting port (not shown in this FIG). Steps of executing the IC test according to the prior art include inserting DUT 17 into sockets 19 on the DUT boards 13, loading the DUT boards 13 into sliced crevices 18 of the oven door 14, closing the oven door 14, and supplying the needed current, voltage, and high temperature conditions with the temperature control oven to perform the test.

The prior-art IC high temperature lifetime test uses a burn-in oven with functions to install patterns to increase temperature and voltage. The oven usually has bandwidth less than 250 channels, clock frequency less than 5 M HZ, and the vector memory size of stress pattern less than 128 K.

However, there are disadvantages for high pin count products (the north and south bridge chips): The prior-art oven usually has bandwidth less than 250 channels, so it does not fit the chips with many pins that it can only do stress test with some signal pins, i.e. it can only uses 1 or 2 of many patterns to be stress pattern. And the vector memory size of stress pattern is less than 128 K so the depth of stress pattern is restricted by memory size. These disadvantages result in low fault coverage rate that there are only few chances to reflect the problems of DUT. Moreover, the frequency is less than 5 M Hz and too far to practical frequency that is usually more than 100 M Hz. In the same condition of stress area and stress time, the DUT can stress 100 times with practical frequency but only does 5 times in test because limited by the oven. The disadvantage results in a very long time to reflect the problems of DUTs.

Because the chances and request time to reflect the problems of DUTs are limited by prior-art burn-in oven tester and the result of DUT test is not the same as the result of chips in practical manufactures, a new testing apparatus is needed that can reflect the problems of practical manufactures correctly in a shorter time.

SUMMARY OF THE INVENTION

It is therefore a primary object of the claimed invention to provide a testing apparatus for reflecting the problems of practical products correctly in a shorter time.

In the embodiment of the present invention, the testing component is coupled onto a motherboard and connected by a stress module. The stress module can be a heater with a heating piece of metal placed over testing component. The stress module can also be a hollow piece of metal that can cover the testing component and heat the component by heat convection or radiation. The stress module can also include a series variable resistor connecting to the testing component, so the voltage of the testing component is controlled to test properties of the component in high voltage condition. In the embodiment of the present invention, the motherboard can also be placed on an anti-electrostatic device like a metal mount for preventing electrostatic disturbance.

The apparatus disclosed by the present invention makes the testing conditions such like voltage and clock frequency the same as the normal practical working conditions of product by heating the testing component at the motherboard by the heater directly. And the test is only for the single testing component of the products, every pin of the chip will be asked to test without the lack of bandwidth channels. So the tests can reflect the problems of the testing components more accurately and need shorter time to perform than prior-art. Furthermore the heater of the apparatus is smaller than prior-art, so the energy cost of test is decreased.

DESCRIPTION OF THE PREFERRED EMBODIMENT

The following detailed description of the present invention describes the testing apparatuses and methods necessary to provide an understanding of the present invention, but does not cover a complete structure composition and the operating theory. The portions relating to the conventional techniques are briefly described, and the parts of the drawings are not proportionally drafted. While embodiments are discussed, it is not intended to limit the scope of the present invention. Except expressly restricting the amount of the components, it is appreciated that the quantity of the disclosed components may be greater than that disclosed.

Figure 1:
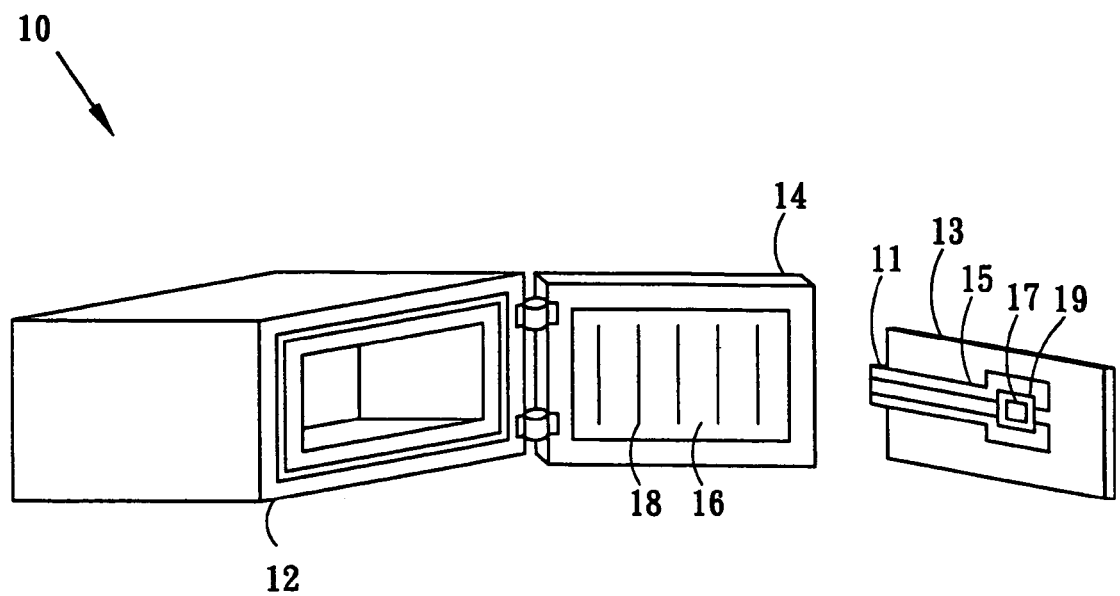
FIG. 1 is a schematic diagram of an IC tester according to the prior art.
Figure 2A:
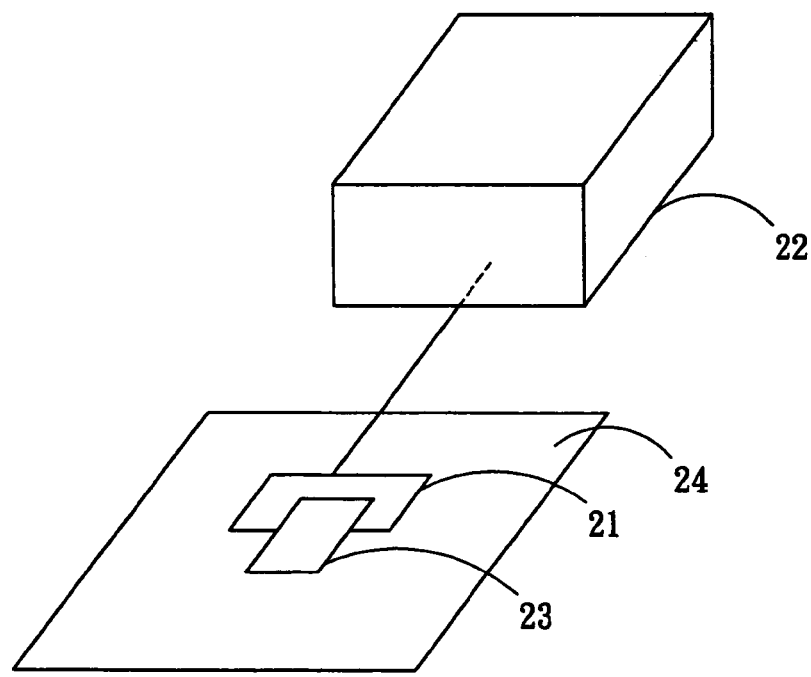
FIG. 2A and FIG. 2B are schematic diagrams of the high temperature testing apparatus according to the embodiments of the present invention.

In the embodiments the testing component is coupled onto the motherboard and a stress module connects to the testing component. The stress module can provide a reliability stress to the testing component to conduct the test. The stress module can be a heater and the reliability stress is temperature stress, so the heater provides heat or temperature stress for the testing component at a required or target testing temperature. FIG. 2A is a schematic diagram of the testing apparatus according to one of the embodiments. The testing apparatus includes a piece of metal 21, a heater 22, a testing component 23 and a motherboard 24. Still referring to FIG. 2A, the piece of metal 21 connects to heater 22 with a wire. After the target temperature is set for the heater 22, the piece of metal 21 can then be placed on testing component 23 and conduct the heating. After the piece of metal 21 reaches the target temperature, the testing patterns can be inputted to the testing component 23 from motherboard 24. In contrast to the prior art that a heater heats without contacting the DUT and the reference temperature is set by the environment of DUT, the heating piece of metal 21 contacts the testing component 23 and the reference temperature is set by the temperature of the testing component 23. Therefore the temperature of the testing component 23 is more accurate in the embodiment of the present invention.

Figure 2B:
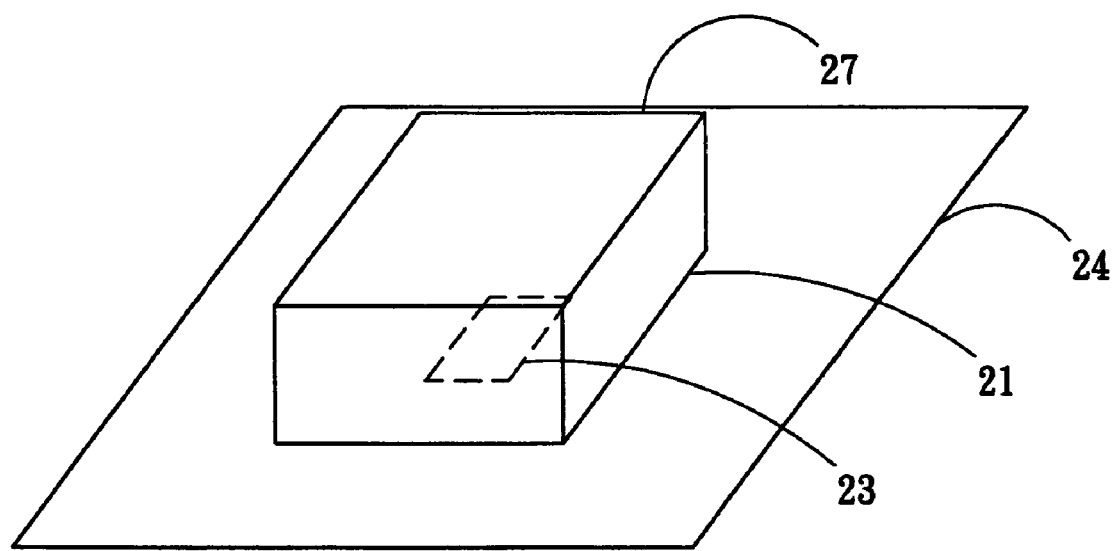

In one of the preferred embodiments, the heater does not have to utilize a piece of metal that contacts the testing component directly. Referring to FIG. 2B, a hollow piece of metal 27 covers the testing component 23 and heats the testing component 23 by heat convection or radiation. Moreover, the testing component 23 can be south bridge chips, north bridge chips, multimedia chips, pocket hard drive chips, IA (Information Access) chips, network chips or other categories of chips.

The motherboard provides practical working conditions the same as products working in a real or practical system to the testing component. For example, the stress patterns are used by the products in practical works, the clock frequency is applied by the products in practical works, and every pin of the testing component is used in practical works. Thus the practical problems of the products occur in the test directly, and the testing results are more accurate than prior-art testers.

Figure 3A:
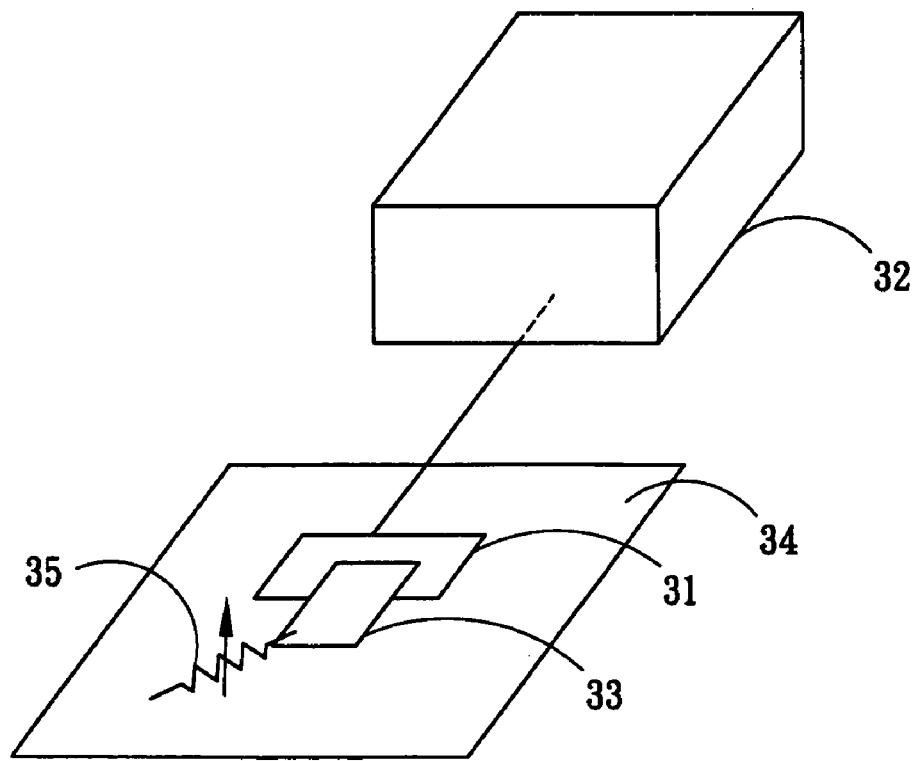
FIG. 3A and FIG. 3B are schematic diagrams of the high voltage testing apparatus according to the embodiments of the present invention.

In another embodiment of the invention, the stress module includes a variable resistor and the reliability stress is voltage. Thus the voltage is provided to the testing component to test. Referring to FIG. 3A, the testing apparatus may include a piece of metal 31, a heater 32, a testing component 33, a motherboard 34, and a variable resistor 35. The piece of metal 31 is connected by a wire to the heater 32. The variable resistor 35 connects the testing component 33 in series. By tuning the variable resistor 35, the power supply can provide different voltage to the testing component 33. Usually the voltage is adjusted to 1.2 times the practical power input. If the target temperature is set for the heater 32, then the piece of metal 31 can be placed on testing component 33 and heat. After the piece of metal 31 reaches the target temperature, the testing patterns can be inputted to the testing component 33 to test. In contrast to the prior art that a heater heats without contacting the DUT and the reference temperature is set by the environment of DUT, the heating piece of metal 31 contacts the testing component 33 and the reference temperature is set by the temperature of the testing component 33. Therefore the temperature of the testing component 33 is more accurate in the embodiment of the present invention.

Figure 3B:
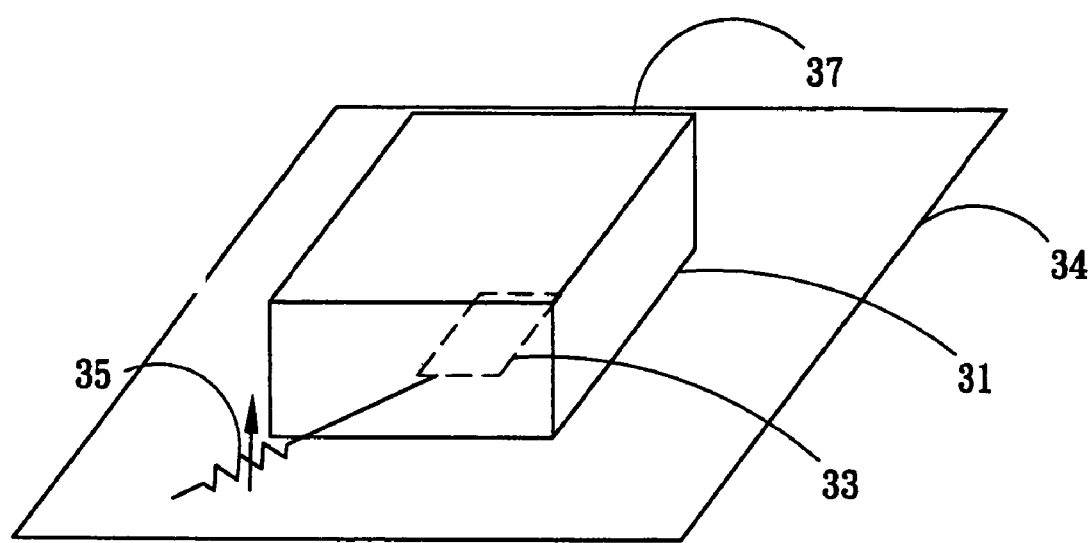

In another of the preferred embodiments, the heater does not have to utilize a piece of metal that contacts the testing component directly. Referring to FIG. 3B, a hollow piece of metal 37 covers the testing component 33 and heats the testing component 33 by heat convection or radiation.

Figure 4A:
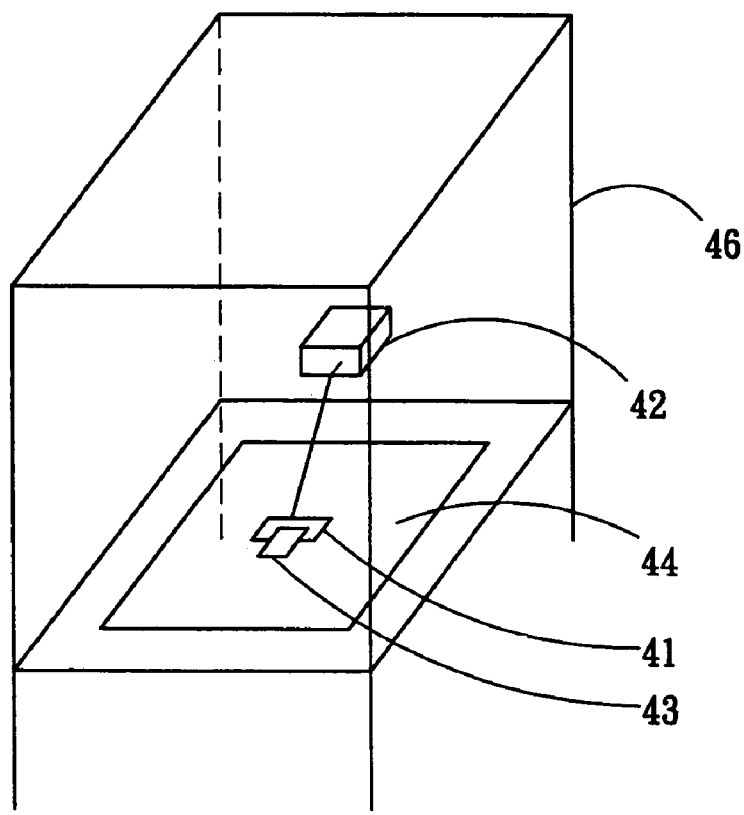
FIG. 4A and FIG. 4B are schematic diagrams of the high voltage testing apparatus placed on a metal mount according to the embodiments of the present invention.

In addition, an anti-electrostatic device supporting the motherboard can be added to the testing apparatus of the invention. The anti-electrostatic device can be a metal mount like iron mount. Referring to FIG. 4A, the testing apparatus can include a piece of metal 41, a heater 42, a testing component 43, a motherboard 44, and an iron mount 46. The piece of metal 41 is connected by a wire to the heater 42. The motherboard 44 is placed on the iron mount 46 and the iron mount 46 can prevent electrostatic disturbance. If the target temperature is set for the heater 42, then the piece of metal 41 can be placed on testing component 43 and heat. After the piece of metal 41 makes the target temperature, the testing patterns can be inputted to the testing component 43 to test. In contrast to the prior art that a heater heats without contacting the DUT and the reference temperature is set by the environment of DUT, the heating piece of metal 41 contacts the testing component 43 and the reference temperature is set by the temperature of the testing component 43. Therefore the temperature of the testing component 43 is more accurate in the embodiment of the present invention.

Figure 4B:
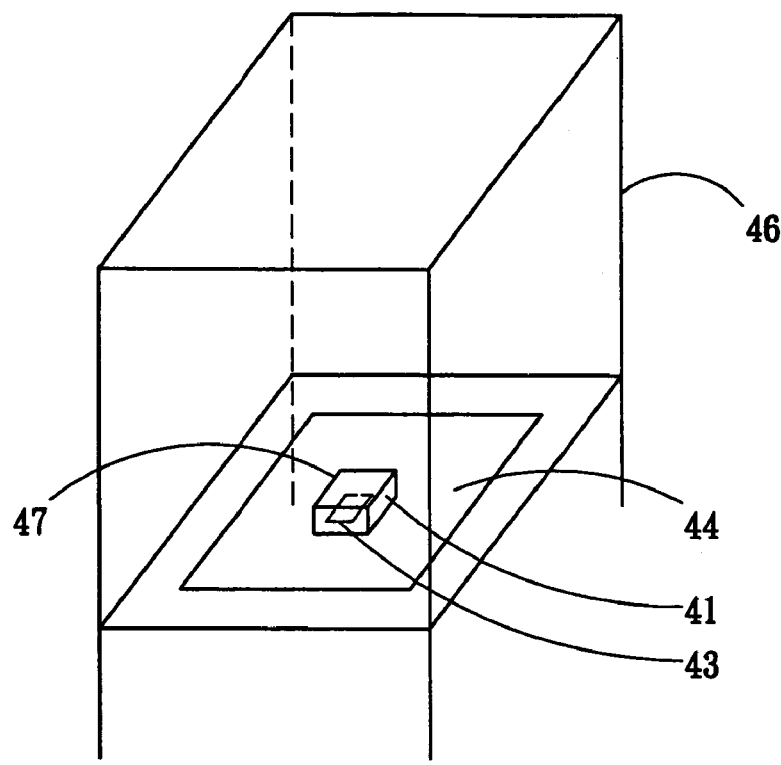

In another of the preferred embodiments, the heater does not have to utilize a piece of metal that contacts the testing component directly. Referring to FIG. 4B, a hollow piece of metal 47 covers the testing component 43 and heats the testing component 43 by heat convection or radiation.

Figure 4C:
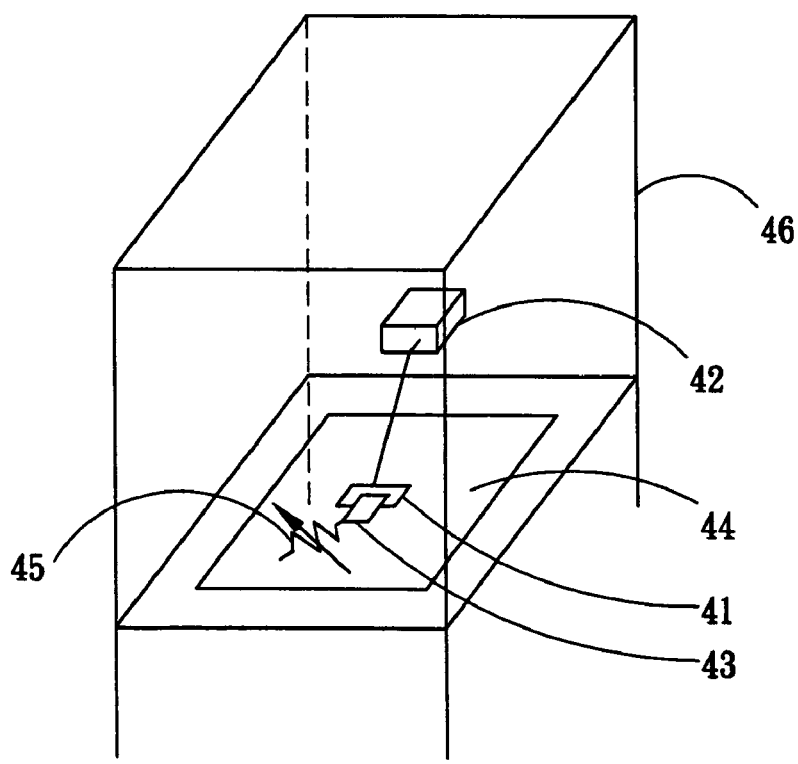
FIG. 4C and FIG. 4D are schematic diagrams of the high voltage testing apparatus placed on a metal mount according to the embodiments of the present invention.

In addition, the voltage of the testing component of the testing device on the iron mount can be adjusted to perform high voltage test. Referring to FIG. 4C, the testing apparatus can include a piece of metal 41, a heater 42, a testing component 43, a motherboard 44, a variable resistor 45, and an iron mount 46. The piece of metal 41 is connected by a wire to the heater 42. The motherboard 44 is placed on the iron mount 46 and the iron mount 46 can prevent electrostatic disturbance. By tuning the variable resistor 45, the power supply can provide different voltage to the testing component 43. Usually the voltage is adjusted to 1.2 times the practical power input. If the target temperature is set for the heater 42, then the piece of metal 41 can be placed on testing component 43 and heat. After the piece of metal 41 reaches the target temperature, the testing patterns can be inputted to the testing component 43 to test.

Figure 4D:
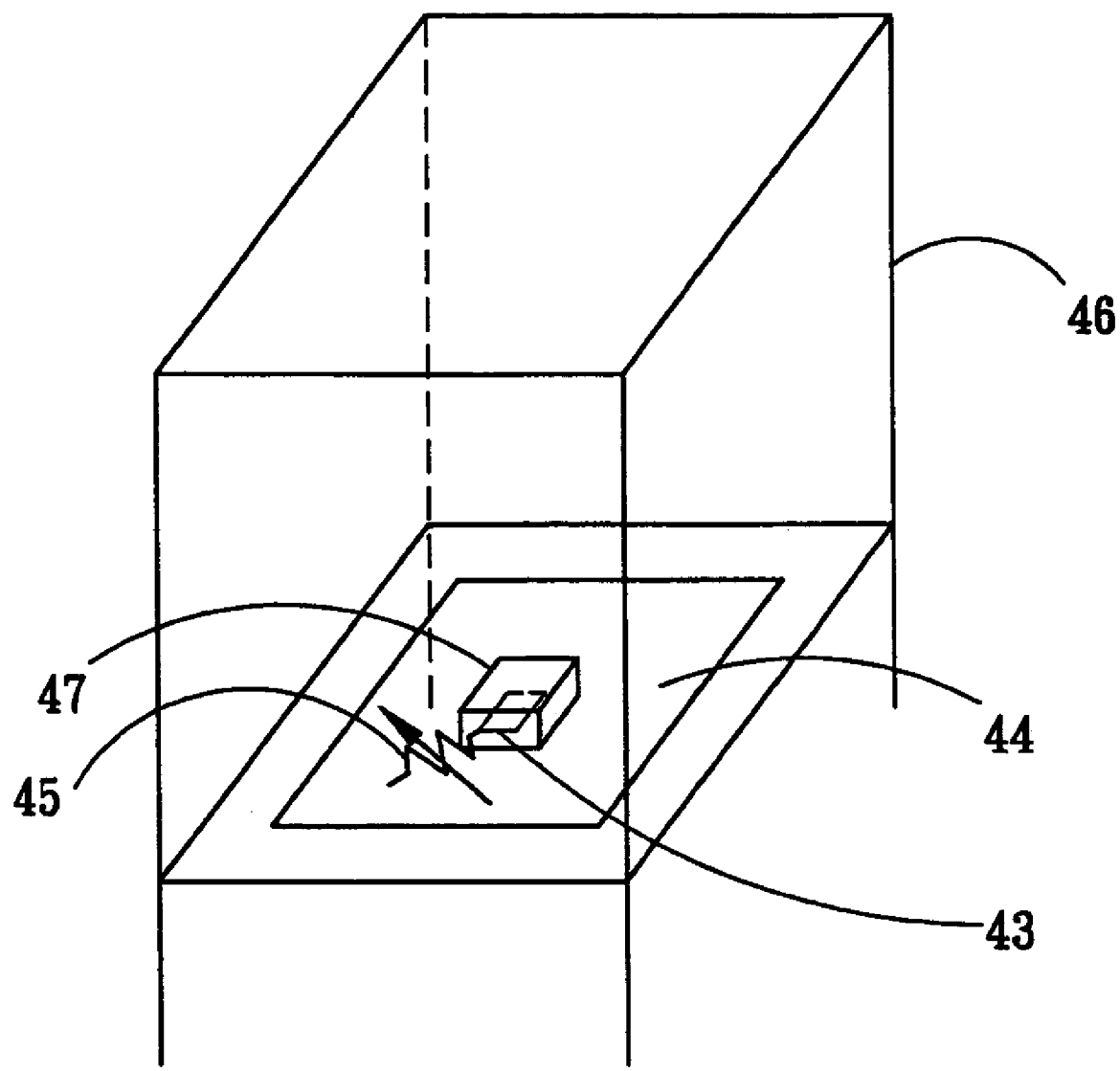

In another of the preferred embodiments, the heater does not have to utilize a piece of metal that contacts the testing component directly. Referring to FIG. 4D, a hollow piece of metal 47 covers the testing component 43 and heats the testing component 43 by heat convection or radiation.

The testing apparatus of the invention provides practical working conditions the same as products working in a practical system to the testing component; the stress patterns are used by the products in practical works, and the clock frequency is applied by the products in practical works. Thus the practical problems of the products occur in the test directly, the testing results are more accurate than prior-art testers, and the required time of the tests decrease. Because the test is only for the single testing component of the products, every pin of the chip will be asked to test without the lack of bandwidth channels.

The foregoing description is not intended to be exhaustive or to limit the invention to the precise forms disclosed.

Obvious modifications or variations are possible in light of the above teachings. In this regard, the embodiment or embodiments discussed were chosen and described to provide the best illustration of the principles of the invention and its practical application to thereby enable one of ordinary skill in the art to utilize the invention in various embodiments and with various modifications as are suited to the particular use contemplated. All such modifications and variations are within the scope of the invention as determined by the appended claims when interpreted in accordance with the breadth to which they are fairly and legally entitled.

What is claimed is:

1. Testing apparatus for testing a testing component, comprising:
   a motherboard having the testing component coupled onto the motherboard; and
   a stress module connecting to said testing component, and said stress module directly contacts said testing component to provide temperature stress to said testing component, wherein said stress module has a voltage provider for providing voltage stress to said testing component.

2. The testing apparatus of claim 1, wherein said stress module comprises:
   a heat provider for providing temperature stress to said testing component.

3. The testing apparatus of claim 2, further comprising:
   a heat providing point connecting to said heat provider and said testing component, and said heat providing point directly contacts said testing component.

4. The testing apparatus of claim 2, wherein said heat provider is an electric heater.

5. The testing apparatus of claim 3, wherein said heat providing point is a piece of metal having a contacting surface contacting to said testing component.

6. The testing apparatus of claim 5, wherein said piece of metal is a piece of iron.

7. The testing apparatus of claim 1, further comprising:
   a voltage adjuster connecting to said voltage provider.

8. The testing apparatus of claim 1, wherein said voltage provider is a power supply.

9. The testing apparatus of claim 7, wherein said voltage adjuster is a variable resistor electrically connecting between said voltage provider and a power input node of said testing component.

10. The testing apparatus of claim 1, further comprising:
    an anti-electrostatic device mounting said motherboard and said testing component.

11. The testing apparatus of claim 10, wherein said anti-electrostatic device comprises an electric conducting mount.

12. The testing apparatus of claim 11, wherein said electric conducting mount is an iron mount.

13. The testing apparatus of claim 1, wherein said testing component is a south bridge chip, a north bridge chip, a multimedia chip, a pocket hard drive chip, an IA chip, or a network chip.

14. A testing method, comprising:
    coupling a testing component onto a motherboard;
    providing a working condition to the testing component by the mother board; and
    providing a reliability stress on the testing component by a stress module, wherein said reliability stress comprises a temperature stress and a voltage stress provided directly on said testing component, and adjusting said voltage stress before providing to the testing component.

15. The testing method of claim 14, wherein said temperature stress utilizes heat conduction passing through a surface of said testing component to inner of said testing component.

16. The testing method of claim 15, wherein said temperature stress utilizes a material of metal performing the heat conduction.

17. The testing method of claim 16, wherein said material of metal is iron.

18. The testing method of claim 14, further comprising:
    preventing said motherboard and said testing component from electrostatic disturbance.

19. The testing method of claim 14, wherein said testing component is a south bridge chip, a north bridge chip, a multimedia chip, a pocket hard drive chip, an IA chip, or a network chip.

* * * * *